(12) United States Patent
Anderson et al.

(10) Patent No.: US 6,720,261 B1
(45) Date of Patent: Apr. 13, 2004

(54) METHOD AND SYSTEM FOR ELIMINATING EXTRUSIONS IN SEMICONDUCTOR VIAS

(75) Inventors: Steven Mark Anderson, Kissimmee, FL (US); Siddhartha Bhowmik, Orlando, FL (US); Joseph William Buckfeller, Orlando, FL (US); Sailesh Mansinh Merchant, Orlando, FL (US); Frank Minardi, Kissimmee, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/586,586

(22) Filed: Jun. 2, 2000

Related U.S. Application Data
(60) Provisional application No. 60/137,075, filed on Jun. 2, 1999.

(51) Int. Cl.[7] ............................................... H01L 21/44
(52) U.S. Cl. ...................................... 438/687; 438/688
(58) Field of Search ................................ 438/618, 620, 438/622, 623, 625, 626, 628, 629, 633, 637, 639, 641, 643, 644, 645, 648, 652, 653, 654, 656, 676, 683, 685, 687–690, 692

(56) References Cited

U.S. PATENT DOCUMENTS 5,789,315 A * 8/1998 Besser et al. ............... 438/624
6,139,699 A * 10/2000 Chiang et al. ......... 204/192.15

* cited by examiner

*Primary Examiner*—Kamand Cuneo
*Assistant Examiner*—Asok Kumar Sarkar

(57) ABSTRACT

A system and method for eliminating interconnect extrusions in vias that are formed during ionized metal plasma processing. By eliminating interconnect extrusions in vias, reliability failures and yield loss are decreased. The extrusions of interconnect metallization occur while wafers are subject to elevated temperatures that cause the internal stresses in the interconnect metallization to transit from a substantially tensile mode to a substantially compressive mode. By controlling the interconnect temperature to be below the temperature at which the interconnect transits from a tensile to a compressive mode, interconnect extrusions in vias are eliminated. The interconnect temperature is controlled by using an actively cooled pedestal in combination with a low temperature IMP deposition process. In addition, the IMP processing time may also be decreased to limit heating of the interconnect.

16 Claims, 4 Drawing Sheets

METHOD AND SYSTEM FOR ELIMINATING EXTRUSIONS IN SEMICONDUCTOR VIAS

CROSS-REFERENCE TO RELATED APPLICATION

This application claims the benefit of U.S. Provisional Application No. 60-137,075, filed Jun. 2, 1999.

BACKGROUND OF THE INVENTION

The invention disclosed herein relates generally to a method and apparatus for fabricating semiconductor integrated circuit devices. More particularly, the present invention relates to method and apparatus for eliminating interconnect extrusions in vias.

As integrated circuits become increasingly smaller and more complex, multiple levels of metallization are used to interconnect circuits on devices. Multilevel metallization is used to conserve chip area while minimizing interconnection resistance. Aluminum and aluminum alloys are generally the predominant interconnect material in metallization systems, but aluminum from the underlying interconnect metallization extrudes into vias during conventional ionized metal plasma ("IMP") processing of the adhesion and barrier layers used for the formation of tungsten plugs in vias.

During metallization, interconnects are formed over metal contacts to provide electrically conductive paths. A dielectric layer is deposited by conventional processes on the metal interconnects. This dielectric layer is etched to form a window or via to expose a portion of the interconnect where the electrical interconnection will be made. The via is then filled with electrically conductive material. To promote formation and to prohibit harmful diffusion, adhesion and barrier layers are used to line the inside of the via before filling the via with an electrically conductive plug material, such as tungsten, copper or copper alloys. Vias are used to electrically connect the metal interconnects on subsequent interconnect levels.

With reference to FIG. 1, a schematic partial sectional view of an example of the first two layers of a conventional submicron, complimentary metal oxide semiconductor (CMOS) device is illustrated. A first dielectric layer 126 is deposited using conventional processes over the gates 120 and the substrate 110. The device level 130 consists of the layers of the semiconductor 100 up to and including the first dielectric layer 126.

A plurality of contacts 124 over the doped source and drain regions 118 may be formed by conventional processes. These contacts 124 are typically made from interconnect materials, such as aluminum, aluminum alloys, tungsten, or other suitable electrically conducting materials known to one skilled in the art. A plurality of interconnects 140 are patterned by photolithography and formed using plasma processing over the metal contacts 124 to form electrically conductive paths. For example, the contact windows 124 may be filled with tungsten deposited using techniques well known in the prior art. The structures may then be planarized using chemical-mechanical polishing or etch-back techniques to form tungsten plugs. A layer of conductive metals is then deposited to form the runners or interconnects 140. The interconnects are made of electrically conductive materials, such as aluminum, aluminum-copper alloys, aluminum-silicon-copper alloys and other aluminum alloys known to one skilled in the art. These aluminum-alloys may be deposited with refractory material under-layers such as titanium, titanium nitride or combinations of both. These multilevel metal stacks may be deposited using sputter deposition techniques, patterned and etched using methods well known in the prior art. A second dielectric layer 142 is deposited by conventional processes on the runners or interconnects 140. Substrates 100 typically may include several interconnect layers 150, wherein a plurality of vias 144 are used to electrically connect the metal interconnects or runners 140 on subsequent interconnect levels.

In FIG. 2, a schematic sectional view of a conventional via structure is illustrated. The via 144 is lined with a coating 155 by IMP techniques. Typically for better chip reliability, the coating will comprise two layers, an adhesion layer 160 which is coated with a barrier layer 165. However, one skilled in the art will recognize that the coating 155 may consist of only one, or may consist of more than two layers. The composition of the adhesion layer 160/barrier layer 165 is generally Ti/TiN, Ta/TaN, W/WN or other materials known to one skilled in the art. A plug 170 is then formed over the barrier layer 165 to fill in the via 144. The plug 170 is comprised of tungsten or other materials known to one skilled in the art. The plug is deposited using conventional methods known to one skilled in the art, such as chemical vapor deposition ("CVD") techniques.

For devices that have large current requirements, designers often route the signals through higher metal interconnect levels, such as the final two levels of metal interconnects 168 shown in FIG. 3. To capitalize on the lower resistivity of copper compared to aluminum, designers often use copper and copper alloys and other materials known to those skilled in the art as the interconnect materials for these high level interconnects 166. The interconnects 166 are surrounded by dielectric layers 162, 163, and 164. The vias 167 connect the interconnects 166 to form electrically conductive paths.

The most common methods used today for depositing copper and copper alloys is electroplating. To deposit copper and copper alloys using an electroplating technique requires the deposition of a conductive seeding layer prior to deposition of the copper or copper alloy plug. Referring to FIG. 4, a schematic sectional view of a conventional via structure for higher level metal interconnects 168 is illustrated. The via 167 is lined with a coating 177. The deposition of copper also requires the prior deposition of an adhesion and barrier layer stack where copper is used in the damascene or dual damascene structures fabricated in the dielectric. Typically for better chip reliability, the coating will comprise three layers, an adhesion layer 172 which is coated with a barrier layer 174 which is then coated with a sceding layer 176. However, one skilled in the art will recognize that the coating 177 may consist of only one, or may consist of more than two layers. Since copper migrates very rapidly through dielectrics, it is contained by depositing barrier layer(s) 174 prior to deposition of the seeding layer 176. Those skilled in the art will recognize that a preferred method of depositing the adhesion layer 172 and barrier layer 174 stack is IMP. One skilled in the art will recognize that the adhesion and barrier layer(s) may be comprised of one or more layers of tantalum/tantalum nitride/tantalum silicon nitride, tungsten/tungsten nitride/tungsten silicon nitride, titanium/titanium nitride or combinations thereof. Copper and copper alloys are the preferred choice for the seeding layer 176. Those skilled in the art will also recognize that a preferred method of depositing the seeding layer 176 is IMP.

During the deposition of refractory materials to form the coating 155, 177 such as the Ti/TiN using IMP techniques, the wafer tends to be heated due to highly localized heating effects. This heat is derived from the plasma, the RF coil used to generate the plasma, and the latent heat of condensation from ion bombardment from the materials being deposited on the wafer. The temperature during IMP processing gets hot enough to result in the aluminum from the underlying interconnect metallization extruding into the vias.

The extrusion of the aluminum from the underlying metallization layer also occurs during IMP deposition of the adhesion/barrier/seeding layers in devices where the higher interconnect levels are copper and the lower level interconnects are aluminum. For example, in a device having six metal interconnect levels where the first four interconnect levels are comprised of aluminum and the last two levels are comprised of copper, when the fifth layer of the copper damascene or dual damascene structure is deposited, the aluminum from the fourth interconnect level extrudes through the via from the fourth level to the fifth interconnect level.

SUMMARY OF THE INVENTION

It is an object of the present invention to provide a method and system for eliminating extrusions of the interconnect metallization into vias during IMP processing.

It is another object of this invention to decrease reliability failures and to decrease yield loss due to interconnect extrusions into vias.

It is yet another object of the present invention to provide a low cost method and system that can be easily implemented in standard processing equipment to eliminate interconnect extrusions into vias during IMP processing.

The above and other objects are achieved by controlling the interconnect temperature during IMP processing. The extrusions of interconnect metallization occur while wafers are subject to elevated temperatures that cause the internal stresses in the interconnect Metallization to transit from a substantially tensile mode to a substantially compressive mode. Once the interconnect metallization is under compression, it relieves stress by extruding into the via etched into the inter-level dielectric on top of the interconnect metallization. By controlling the interconnect temperature to be below the temperature at which the interconnect stress transits from a tensile to a compressive mode, interconnect extrusions in vias are eliminated. By eliminating these extrusions, wafer reliability is improved and processing yield loss due to a high number of defects is decreased.

In one embodiment, the interconnect temperature is controlled by using an actively cooled pedestal in combination with a low temperature IMP deposition process, thereby preventing aluminum extrusions from poisoning the vias.

In another embodiment, in addition to active pedestal cooling and low IMP processing temperatures, the IMP processing time is decreased to limit heating of the interconnect.

BRIEF DESCRIPTION OF THE DRAWINGS

The invention is illustrated in the figures of the accompanying drawings which are meant to be exemplary and not limiting, in which like references refer to like or corresponding parts, and in which.

DETAILED DESCRIPTION OF THE PREFERRED EMBODIMENTS

Figure 1:
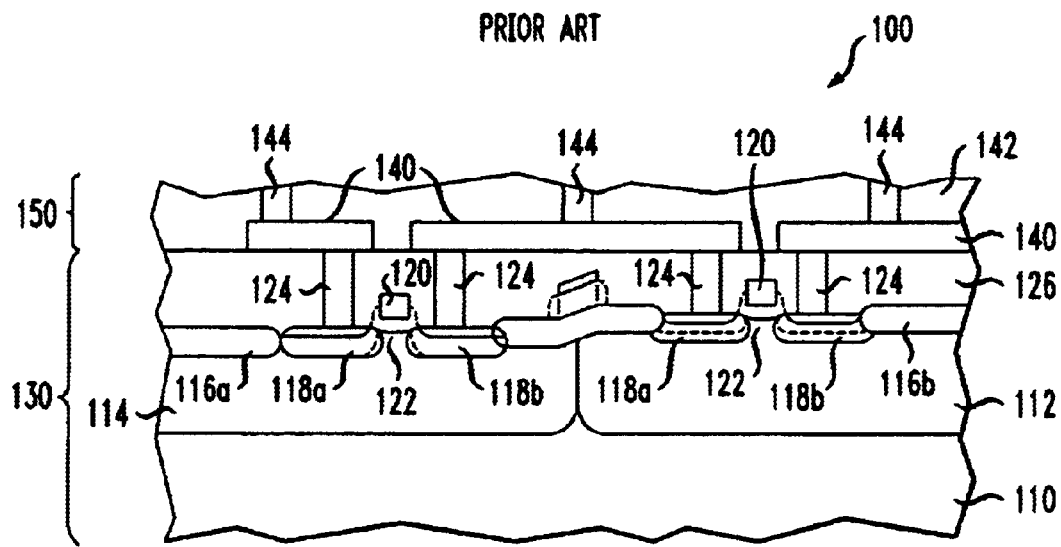
FIG. 1 is a schematic sectional view of the first two layers of a prior art submicron, twin-tub, complimentary metal oxide semiconductor (CMOS) device showing one of a plurality of interconnect levels.
Figure 2:
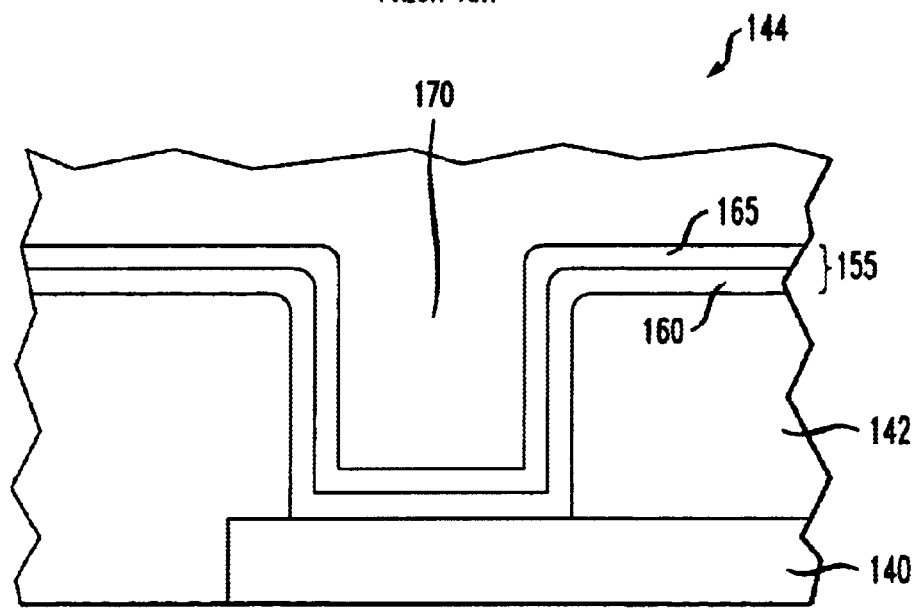
FIG. 2 is a schematic sectional view of a prior art via metallization structure of the first two layers of a semiconductor device.
Figure 3:
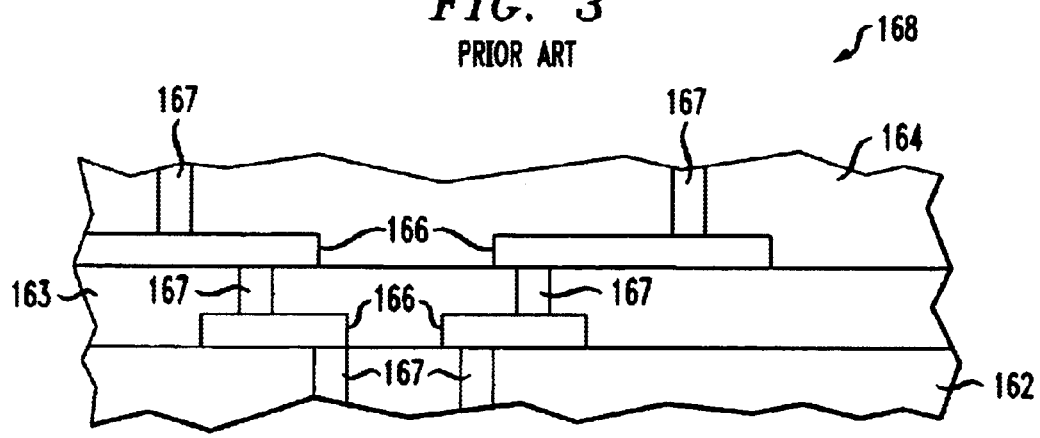
FIG. 3 is a schematic sectional view of the higher level interconnect layers of a semiconductor device.
Figure 4:
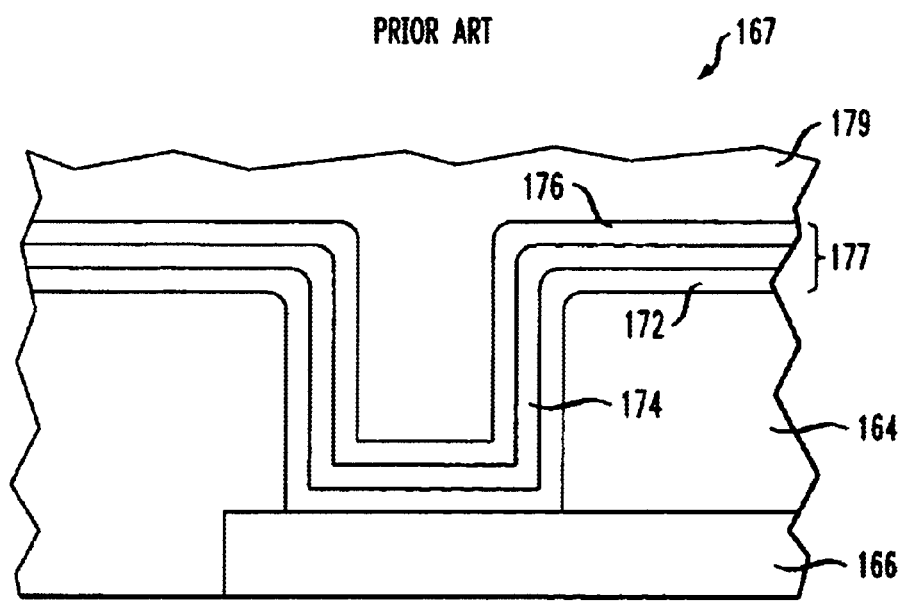
FIG. 4 is a schematic sectional view of a prior art via metallization structure of the high level interconnects in a semiconductor device.
Figure 5:
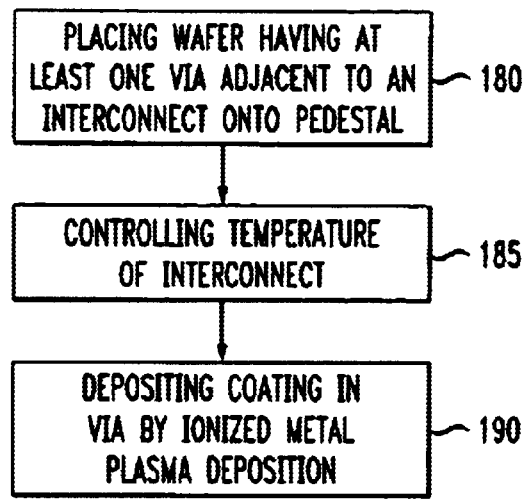
FIG. 5 is a flow diagram of one embodiment of the present invention of a method for eliminating interconnect extrusions in vias.
Figure 6:
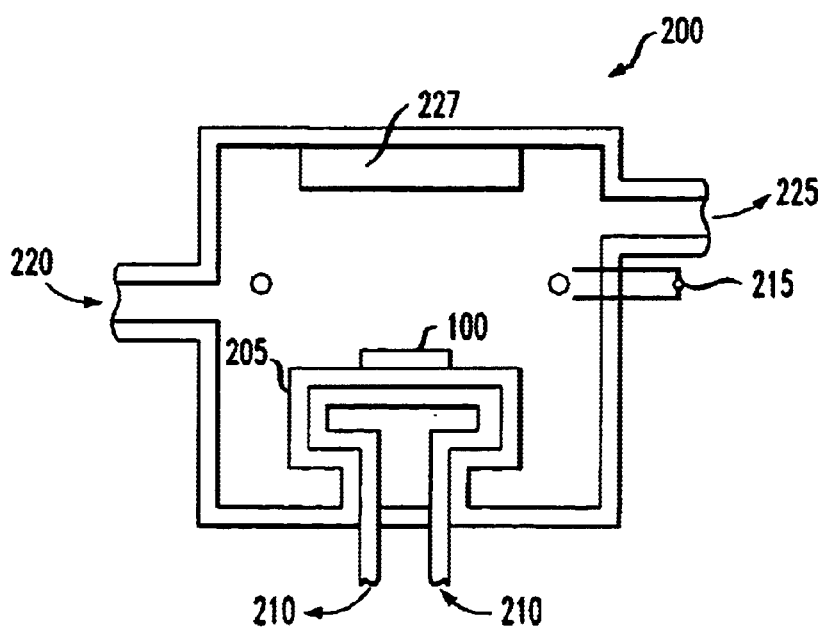
FIG. 6 is a schematic sectional view of one embodiment of the present invention for a system for eliminating interconnect extrusions in vias.

In the present invention, FIG. 5 depicts an example embodiment of the process of the present invention. Referring to FIGS. 2, 3, and 6, at least one wafer having at least one via 144 adjacent to an interconnect 140 is placed onto a pedestal 205 in step 180. The interconnect 140 is typically made from aluminum, aluminum alloys and other materials known to one skilled in the art. When the interconnect metallization is deposited onto the wafer by processing techniques known to those skilled in the art, such as plasma vapor deposition, the interconnect metallization is generally in a substantially tensile mode.

In step 185, the temperature of the interconnect 140 is controlled. The temperature is controlled, step 185, so that the interconnect temperature stays below the temperature at which the interconnect stress transits from a substantially tensile mode to a substantially compressive mode. This transition in the stress from tensile to compressive mode occurs due to the difference in the coefficients of thermal expansion of the interconnect 140 material and the dielectric 142 material surrounding the interconnect 140 and the substrate material 110 which is typically silicon. The coefficient of thermal expansion for the metal interconnect 140 is greater than that of the dielectric 142. During heating, the interconnect 140 can not expand because it is restrained by the dielectric 142 so it transits into a compressive stress mode. To relieve these internal compressive stresses, the interconnect 140 extrudes into the via openings. By controlling the interconnect 140 temperature in step 185 to be below the temperature at which the interconnect 140 stress transits from a substantially tensile mode to a substantially compressive mode, interconnect extrusions in the vias 144 are eliminated.

In step 190, the coating 155 is deposited using ionized metal plasma deposition. IMP techniques are known to those skilled in the art for the deposition of the refractory materials that typically comprise the coating 155. Generally, the coating 155 will consist of two layers, an adhesion layer 160 lining the via 144 covered by a barrier layer 170. These two layers comprise Ti/TiN, Ta/TaN, W/WN, or other materials known to those skilled in the art.

In one embodiment of the present invention, the temperature is controlled in step 185 by actively cooling the pedestal 205 and by using a low temperature depositing process in step 190. However, the use of low process temperatures only, or an actively cooled pedestal by itself, does not eliminate interconnect extrusions in vias. Actively cooling the pedestal in one embodiment of the invention is achieved by heat transfer to a medium flowing through the pedestal.

The flowing medium may be a gas or a liquid phase. The flowing medium is comprised of water, helium, argon, liquid or gaseous nitrogen, refrigerant gases or fluids or other materials known to one skilled in the art. Conventional IMP deposition subjects the wafer to temperatures of about 200° C. or more. In one embodiment of the present invention, the wafers are subjected to temperatures less than about 200° C., preferably less than about 100° C.

In another embodiment, the temperature is controlled in step 185 by decreasing the time to deposit the coating 155 in step 190, in addition to actively cooling the pedestal 205 and using low processing temperatures in step 190. By decreasing the time to deposit the coating 155, the wafer 100 is subject to less heating. Deposition time is decreased by using a faster deposition rate. The faster deposition rate is achieved by changing the gas ratio during the depositing step 190.

Referring to FIG. 6, one embodiment of the present invention for a system for fabricating a via wherein the interconnect temperature is controlled to prevent the stress within the interconnect from transiting from the tensile mode to the compressive mode is illustrated. The system 200 is comprised of a chamber having an inlet into which the processing gas 220 is selected according to the desired coating that is to be produced inside the via. For example, to deposit TiN, the processing gas 220 is nitrogen. The system also contains a pedestal (205) that is actively cooled by flowing a medium 210 through the pedestal 205. The pedestal 205 may or may not be biased during deposition. At least one wafer 100 having at least one via adjacent to an interconnect is placed on the pedestal 205. The RF coil 215 generates the plasma. The target 227 is made from the material desired to be deposited as part of the coating. For Ti/TiN deposition, the target 227 is made of titanium.

Typical processing parameters for one embodiment of the present invention for Ti/TiN deposition are: a direct current (dc) power of approximately 3,000 watts to approximately 4,500 watts, preferably approximately 4,000 watts; a radio frequency (rf) coil power of approximately 1,500 watts to approximately 3,000 watts, preferably approximately 2,500 watts; and an alternating current (ac) bias to the wafer of approximately 100 watts to approximately 500 watts, preferably approximately 400 watts. One skilled in the art will recognized that a higher rf coil power will result in higher temperatures and that the ac bias to the wafer attracts ions to the wafer, thereby increasing sidewall and bottom coverage of the via. The deposition time will depend on the coating material being deposited and the desired final thickness of the coating material. For example, the deposition time for approximately 200 angstroms of titanium nitride will be approximately 48 seconds to approximately 55 seconds and the deposition time for approximately 300 angstroms of titanium nitride will be approximately 75 seconds to approximately 85 seconds using the above processing parameters. The typical gas flow using these processing parameters for a mixture of argon and nitrogen gas is approximately 15 sccm to approximately 30 sccm of argon and approximately 18 sccm to approximately 45 sccm of nitrogen. Preferably, the gas flow rate is approximately 25 sccm of argon and approximately 28 sccm of nitrogen.

Figure 7:
FIG. 7 is a scanning electron micrograph showing interconnect extrusions into the vias from the conventional process.
Figure 8:
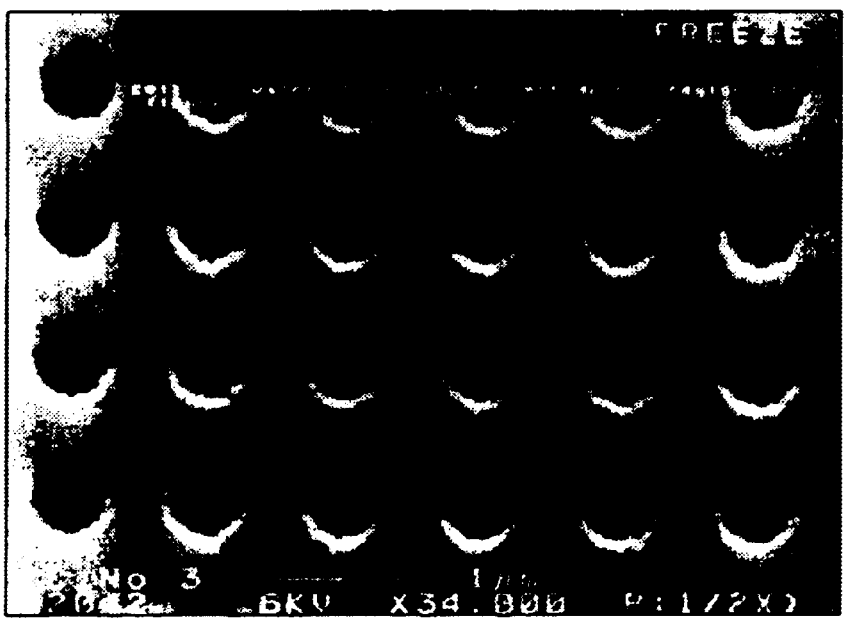
FIG. 8 is a scanning electron micrograph showing no extrusions into the vias from the process of one embodiment of the present invention.

FIG. 7 is a picture taken using the scanning electron microscope of vias formed using conventional processing. FIG. 7 illustrates interconnect extrusions in the vias. FIG. 8 is a picture taken using the scanning electron microscope showing no extrusions into vias formed using the process of one embodiment of the present invention.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A method of fabricating vias, comprising:
   placing onto a pedestal at least one semiconductor wafer having at least one via adjacent to an interconnect metallization;
   controlling the temperature of the interconnect metallization to be less than the temperature at which the interconnection metallization stress transits from a tensile mode to a compressive mode by actively cooling the pedestal; and
   depositing a coating to line the via using a low temperature deposition process.

2. The method of claim 1 wherein the interconnect metallization is selected from the group consisting of: aluminum, aluminum alloys, copper and copper alloys.

3. The method of claim 1 wherein actively cooling the pedestal comprises transferring heat to a medium flowing through the pedestal.

4. The method of claim 3 wherein the flowing medium is water.

5. The method of claim 3 wherein the flowing medium is liquid nitrogen.

6. The method of claim 3 wherein the flowing medium is helium.

7. The method of claim 1 wherein the coating is deposited by IMP.

8. The method of claim 1 wherein the coating comprises two layers.

9. The method of claim 8 wherein the two layers comprise an adhesion layer and a barrier layer.

10. The method of claim 8 wherein the two layers are selected from the group consisting of one or more layers or combinations of: tantalum, tantalum nitride, tantalum silicon nitride, tungsten, tungsten nitride, tungsten silicon nitride, titanium, and titanium nitride.

11. The method of claim 1 wherein the coating comprises three layers.

12. The method of claim 11 wherein the three layers comprise an adhesion layer, a barrier layer and a seeding layer.

13. The method of claim 11 wherein the three layers are selected from the group consisting of one or more layers or combinations of: tantalum, tantalum nitride, tantalum silicon nitride, tungsten, tungsten nitride, tungsten silicon nitride, titanium, titanium nitride, copper, and copper alloys.

14. The method of claim 1 wherein the interconnect metallization temperature is no greater than about 100° C.

15. The method of claim 1 wherein the interconnect metallization temperature is further controlled by decreasing the time for depositing the coating.

16. The method of claim 15 wherein the interconnect temperature is controlled by decreasing the time for depositing the coating.

* * * * *